United States Patent [19]
Klein

[11] Patent Number: 5,641,301
[45] Date of Patent: Jun. 24, 1997

[54] LEAD-IN GUIDE FOR PRINTED CIRCUIT BOARDS

[75] Inventor: Peter P. Klein, Phoenixville, Pa.

[73] Assignee: Unisys Corporation, Blue Bell, Pa.

[21] Appl. No.: 414,511

[22] Filed: Mar. 31, 1995

[51] Int. Cl.⁶ .................................................. H01R 13/64
[52] U.S. Cl. .................................... 439/377; 361/802
[58] Field of Search ..................... 439/377, 64; 361/802; 211/41

[56] References Cited

U.S. PATENT DOCUMENTS

| | | | |
|---|---|---|---|
| 3,723,823 | 3/1973 | Lit et al. | 317/101 DH |
| 4,019,099 | 4/1977 | Calabro | 361/399 |
| 4,068,290 | 1/1978 | Wetherbee | 361/415 |
| 4,075,683 | 2/1978 | Johansson et al. | 361/415 |
| 4,167,032 | 9/1979 | Scagnelli | 361/415 |
| 4,335,819 | 6/1982 | Weisman et al. | 361/802 |
| 4,399,485 | 8/1983 | Wright et al. | 361/383 |
| 4,429,937 | 2/1984 | Stockmaster | 339/65 |
| 4,508,228 | 4/1985 | Erlam | 211/41 |
| 4,509,647 | 4/1985 | Shevchuk | 361/802 |
| 4,574,959 | 3/1986 | Hollett | 211/41 |
| 5,008,778 | 4/1991 | Peyerl | 361/415 |

*Primary Examiner*—Khiem Nguyen
*Assistant Examiner*—Yong Ki Kim
*Attorney, Agent, or Firm*—John F. O'Rourke; Mark T. Starr; Steven R. Petersen

[57] ABSTRACT

A lead-in guide and starting locator for use with a sheet metal card guide or similar structure is disclosed. The disclosed lead-in guide is preferably of a one piece construction and is most preferably molded or machined from a plastic material. The lead-in guide of the present invention provides multiple board lead-in slots and preferably includes integral retention pegs for quick mechanical attachment or can be held in place by a separate fastener. In a preferred embodiment, the lead-in guide has a top surface cut by a series of grooves that will be aligned with the slots in the card guide. Preferably, the lead-in guide has a front section that is somewhat thicker than the rest of the lead-in guide. As explained below, this permits the grooves to be cut to a depth such that the bottom of the groove in the thicker section is aligned with the bottom of the slots in the card guide, and the groove through the thinner section is actually cut all the way through such that its bottom surface is the sheet metal rack when it is installed.

14 Claims, 2 Drawing Sheets

LEAD-IN GUIDE FOR PRINTED CIRCUIT BOARDS

The present invention relates to apparatus for retaining circuit boards and the like within electronic equipment enclosures.

BACKGROUND OF THE INVENTION

Printed circuit board chassis are typically fabricated using stamped and formed sheet metal so that they meet structural requirements while maintaining low tooling costs, reduced design time and reduced delivery time. Stamped sheet metal chassis typically also provide structures compatible with creating proper airflow through a cabinet and minimize wall thicknesses, an important consideration for clearances within densely packed enclosures.

Printed circuit boards themselves are usually densely populated, and are therefore heavy and can easily be damaged when they are inserted into tightly-spaced card racks. This problem is aggravated when individual card guides formed in sheet metal components are set back from the front of the rack due to design constraints such as existing tooling, air management, nut bar locations, and the like.

Stamped sheet metal circuit card racks are nonetheless presently the preferred type of chassis, despite the limitations they impose on the lead-in or starting position for inserting boards. The leading edge of the guide should be gradual and curved, to conform to stamping and forming requirements, however, as noted above, the stamped construction also often dictates that it is recessed from the front of the chassis. A recessed lead-in, however, is not desirable since the distance between the edge of the rack and the entry point of the lead in provides an opportunity for misalignment and card damage. Thus, there is a need to develop improvements in stamped sheet metal circuit card guides, and in particular it would be desirable to improve the lead-in and move the entry point closer to the edge of the enclosure.

A number of prior patents disclose card mounting slots molded in plastic that extend across the full width of the enclosure. For example, U.S. Pat. No. 3,723,823—Lit et al. discloses a printed circuit board guide of molded plastic which, as illustrated in FIG. 2 thereof, has an integral molded lead-in section and a board-retaining section. The disclosed printed circuit board guide extends across the width of the enclosure and is substantially the same length as the width of the board being held in place. U.S. Pat. No. 4,019,099—Calabro discloses a printed circuit board guide in the form of a track mounting device molded from plastic that extends across the width of the enclosure and is substantially the same width as the width of the board that is being retained. The plastic board mounting device is attached to the sheet metal of the electronics enclosure using integral elements in the form of a split post that acts as a fastener. U.S. Pat. No. 4,068,290—Wetherbee discloses a device for use in an enclosure that has full length card slots disposed a fixed distance apart. A disclosed cantilever card guide is affixed to one side wall of the enclosure and also extends across the full width, permitting circuit boards of less than the full height to be mounted in the enclosure.

Others have attempted to create improved card guides using full width metal channels, as shown in U.S. Pat. No. 5,008,778—Peyerl, which discloses a card guide that has a lead-in section, and is adaptable to accommodate either the edge of a circuit board in a groove, or to present an edge that engages a groove in a circuit card. U.S. Pat. No. 4,429,937—Stockmaster discloses a rack formed from structural shapes of metal that has full length card slots individually mounted on the angle pieces that form the frame of the enclosure.

It is also known in the prior art to retain a circuit card only near its edges, i.e., the channel in which the card rests does not extend across the full width of the enclosure. These types of card guides are not used in conjunction with another card guide, such as a sheet metal card guide, but function as both the lead-in and the card retention structure. U.S. Pat. No. 4,508,228—Erlam discloses modular card frames adaptable between two different heights. The card locations are defined by end pieces that are connected by a bar, and the end pieces are attached to the assembly by pegs that extend from cross rails. U.S. Pat. No. 4,167,032—Scagnelli discloses edge guides that are a series of spring fingers that both guide and support the circuit board. U.S. Pat. No. 4,399,485—Wright et al. discloses edge guides that are essentially a flat bar with grooves running across the width of the bar.

A lead-in guide placed in front of a card guide is disclosed in U.S. Pat. No. 4,075,683—Johansson et al. The disclosed design provides a molded lead-in portion that is slid into a specially designed bar by the cooperation of a molded flange on the lead-in guide and a groove in the bar.

The molded card slots, edge guides, lead-in guides and other alternate construction techniques disclosed in the prior art discussed immediately above all require greater tooling costs as well as increased material wall thicknesses. As noted above, increasing wall thicknesses is not desirable since the increased chassis material reduces the available space within the enclosure. Thus, there remains a need for improvements in the lead in section of stamped metal circuit card guides.

SUMMARY OF THE INVENTION

It has now been found that a more effective lead-in guide and starting locator that works well with the sheet metal construction typically used in electronics chassis is provided by a separate lead in element affixed to the sheet metal racks. The lead-in guide made in accordance with the present invention provides visible and early lead-in for printed circuit boards when inserted into a supporting card rack. The lead-in guide provided by the present invention also provides more pronounced board entry areas than is possible in sheet metal due to processing limitations. The disclosed lead-in guide is preferably of a one piece construction and is most preferably molded or machined from a plastic material. The lead-in guide of the present invention provides multiple board lead-in slots and preferably includes integral retention pegs for quick mechanical attachment or can be held in place by a separate fastener.

In a preferred embodiment, the lead-in guide has a top surface cut by a series of grooves that will be aligned with the slots in the card guide. Preferably, the lead-in guide has a front section that is somewhat thicker than the rest of the lead-in guide. As explained below, this permits the grooves to be cut to a depth such that the bottom of the groove in the thicker section is aligned with the bottom of the slots in the card guide, and the groove through the thinner section is actually cut all the way through such that its bottom surface is the sheet metal rack when it is installed.

DETAILED DESCRIPTION OF THE PREFERRED EMBODIMENTS

Figure 1:
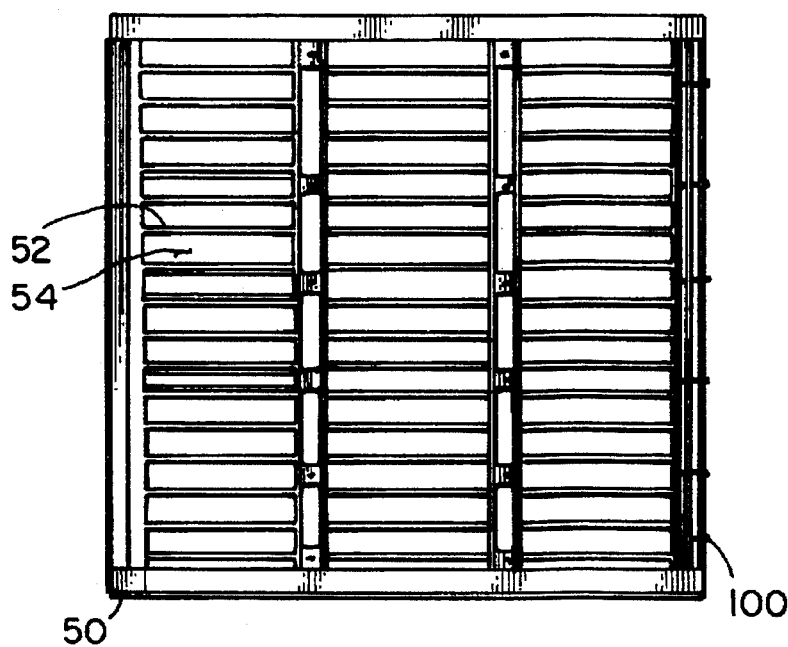
FIG. 1 is top plan view of a stamped sheet metal card guide which has a lead-in guide made in accordance with the present invention.

Referring now to FIG. 1, an example of a stamped and formed sheet metal card guide 50 as described above is shown. The card guide 50 has a number of parallel slots 52 that receive an edge of a circuit board. Typically, spaces 54 are formed between the slots 52 to improve air circulation, reduce weight and permit visual inspection and access to the boards. As seen in FIG. 1, a typical stamped card guide 50 leaves a border of metal around its perimeter and, as a result, the lead in area for the circuit board is severely limited in terms of its location and design. Thus, in accordance with the present invention, it has now been found that placing a specially designed lead-in guide 100 at one edge of the card guide 50 greatly reduces the likelihood that a card being inserted into the slots 52 will be damaged and otherwise improves the usefulness of the card guide 50.

Figure 2:
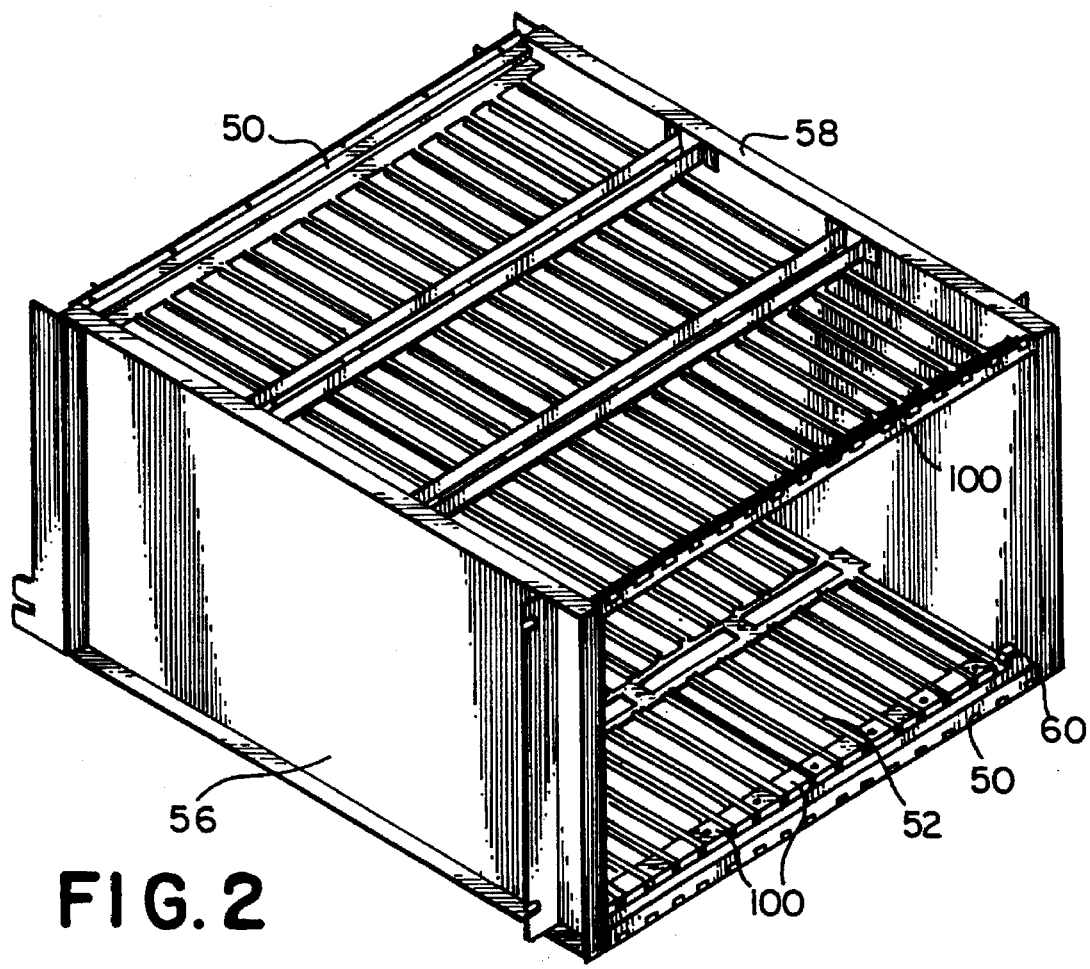
FIG. 2 is an isometric view of a pair of card guides as shown in FIG. 1 that have been assembled into a housing for circuit cards.

Further details of the present invention can be seen in FIG. 2 which illustrates two of the card guides 50 shown in FIG. 1 that have been assembled into a housing for circuit cards. This assembly can be an enclosure or cabinet in and of itself or, more typically, is a sub-assembly that is inserted into a rack, enclosure or similar structure. As seen in FIG. 2, the card guides 50 are held in a spaced relationship by end plates 56,58 and are fastened together with rivets or screws. In the embodiment shown, a bar 60 connects the plates 56,58. A bar of this type is typically provided at the four corners of the assembly to add rigidity and strength. The construction of both the individual components is well known in the art, as is the techniques for assembling the components into structures such as that shown in FIG. 2.

FIG. 2 also illustrates the placement of the lead-in guides 100 that are made in accordance with the present invention. A lead-in guide 100 is affixed to each card guide 50 so that the pair form a set of opposing lead-in slots that accept the opposite edges of the individual circuit boards that slide into the slots 52 in the card guides 50.

Figure 3:
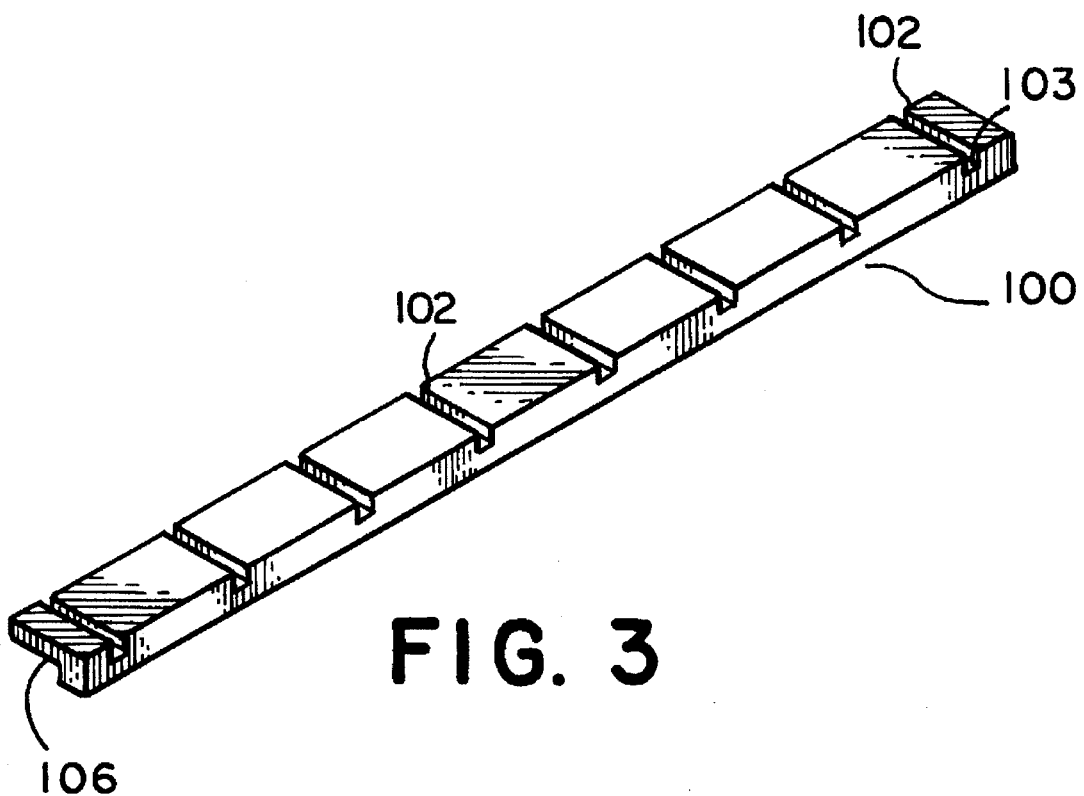
FIG. 3 is an isometric view of a lead-in guide made in accordance with the present invention.

Referring now to FIG. 3, further details of the construction of the lead-in guide 100 made in accordance with the present invention are illustrated. The lead-in guide 100 most preferably has a number of grooves 102 formed on its upper surface. The grooves 102 are of a sufficient number to match the grooves in the card guide that cooperates with the lead-in guide 100, or some subdivision thereof. In other words, a lead-in guide 100 can be made with one-half, one-third or some other fraction of the required slots 52, and the corresponding number of units used within an assembly as required. Each groove 102 is preferably provided with a lead-in section 103 that is tapered and somewhat wider than the groove to further facilitate the entry of the circuit board into the assembly.

In accordance with preferred embodiments of the present invention, the grooves are most preferably of a depth that permits the bottom of the groove 102 in the lead-in guide 100 to be approximately at the same level as the bottom of the slot 52 in the card guide 50 such as that which was described above with reference to FIGS. 1–2. In order to accomplish the aforementioned preferred groove depth, the preferred embodiment illustrated includes a front block section 106 that creates a ledge or lip that also permits alignment with the front edge of the card guide 50 and/or any associated structure in the assembly.

Figure 4:
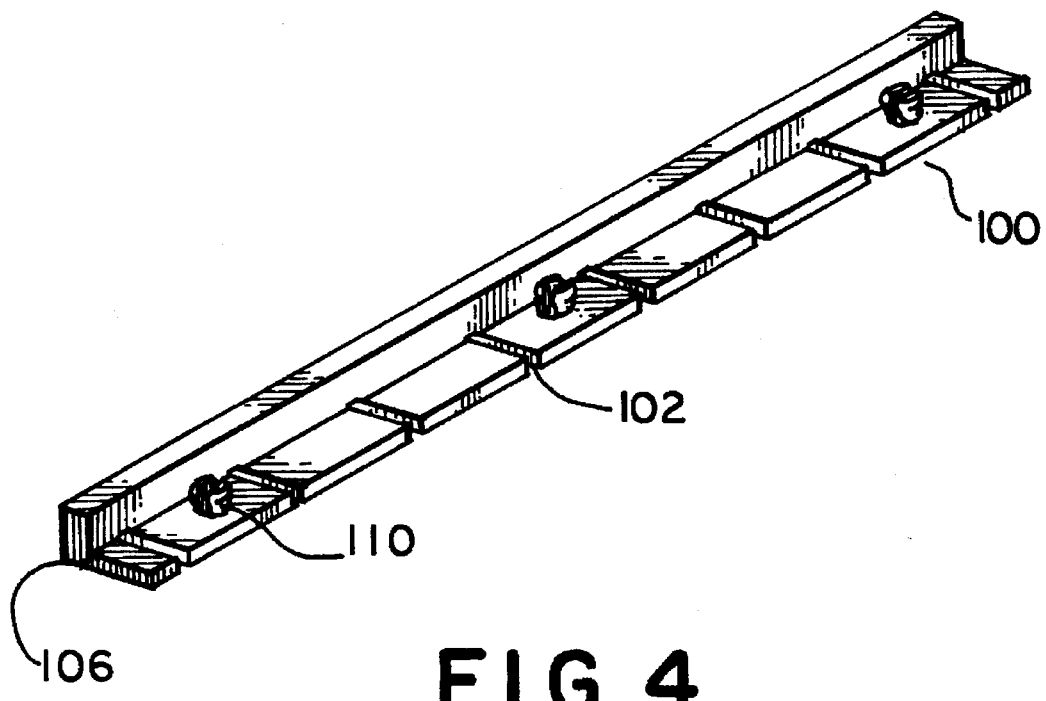
FIG. 4 is an isometric view illustrating the bottom side of the lead-in guide made in accordance with the present invention that is illustrate in FIG. 3.

Referring now to FIG. 4, a bottom view of the preferred embodiment of the lead-in guide 100 illustrated in FIG. 3 is shown. In this view, it can be seen that the grooves 102, at least in the rearward portion, extend through the entire thickness of the material, thereby dividing this portion of the led in guide 100 into individual "tabs." When installed, these tabs will typically overlie the sheet metal in front of the slots 52 in the card guide, which will form the "bottom" of the groove, and this bottom will of course be at the same level as that of the slot 52 itself. The thicker front block section 106, however, is not cut all the way through, and thus maintains the lead-in guide 100 as a unitary member.

Also visible in FIG. 4 are the retention pegs 110 that are preferably provided to retain the lead-in guide 100 in position. The retention pegs 110 are preferably generally circular in cross-section and are split, with a tapered tip and undercut or shoulder that will permit a resilient locking to take place when the retention pegs are pressed through a hole of the appropriate diameter. It will be understood, however, that the retention pegs 100 can be of any of a number of designs, including circular and non-circular pegs that engage the sheet metal by an interference fit, a snap fit or by being deformed in the manner of a rivet. Alternatively separate fasteners such as screws, pins, rivets, or the like could be employed. Any attachment method will suffice that meets the appropriate standards and design considerations so that the lead-in guide 100 is considered firmly fixed to the card guide 50.

The lead-in guide of the present invention is preferably molded or machined from plastic. In its molded embodiment, the lead-in guide is particularly adaptable to suit any of a number of specialized requirements. In certain embodiments, various widths are available to be used or multiples of some common width provided to minimize the size and number of tool, molds and fixtures required to mass produce the present invention. The geometry of the lead-in guide made in accordance with the present invention can vary and the actual lead-in start position can be a far front as possible without interfering with card front panels. Preferably, molded snap in retaining posts provide quick assembly, while molded in color could enhance visual positioning of boards into the guide by providing an indication as to the type of board the slot is to receive.

Because the lead-in guide of the present invention is an add on to a sheet metal printed circuit board rack and thus does not impact the economics of stamping card guides directly into the sheet metal, a typical construction technique. For this same reason, the lead-in guide of the present invention also is easily adapted to an existing chassis.

Although certain embodiments of the present invention have been described above with particularity, these embodiments are meant to illustrate the invention and are not meant to limit its scope. Upon review of the foregoing specification, those of skill in the art will realize many adaptations, modifications and variation of the components described above that utilize the present invention while departing from the specific design illustrated. For example, the size and aspect ratios of the lead-in guides can be readily varied, as well as the ornamental aspects of their design. Similarly, the card guides described and illustrated above are merely for illustration. Numerous types of card racks, card guides and the like can be designed differently and of different materials, including plastic, yet still support circuit boards. Finally, although the present invention has been described with particular relation to stamped sheet metal card guides, it will be realized that the lead-in disclosed may be adapted to any card-receiving slot that has an insufficient or inadequately designed lead in section. Thus, reference should be made to the appended claims in order to ascertain the full scope of the present invention.

What is claimed is:

1. A lead-in guide component for attachment to a card carrier chassis comprising:

a surface having grooves of a length that is a minor portion of the length of a slot in a card guide;

a front block section; and one or more pre-defined attachment points comprising one or more pegs extending from a bottom surface, wherein the grooves are aligned with slots in the card guide when the lead-in guide is mounted to the card carrier chassis.

2. The lead-in guide of claim 1, wherein the grooves include a bottom surface, whereby when the lead-in is attached to a card guide, the bottom surface is aligned with a bottom surface of a groove in a card guide.

3. The lead-in guide of claim 2, wherein the bottom surface extends only across the front block section.

4. The lead-in guide of claim 1, wherein the one or more pre-defined attachment points comprise one or more pegs extending from a bottom surface.

5. The lead-in guide of claim 1 formed of a plastic material.

6. An assembly comprising a sheet metal card guide comprising a plurality of slots, each for receiving a circuit board; and a separate lead-in guide affixed to an edge of the card guide the lead in guide comprising:

a surface having grooves of a length that is a minor portion of the length of a slot in a card guide and one or more pre-defined attachment points comprising one or more pegs extending from a bottom surface.

7. The assembly of claim 6, wherein the lead-in guide comprises a plurality of grooves, a front block section and one or more pre-defined attachment points, wherein the grooves are aligned with slots in the card guide when the lead-in guide is mounted to a chassis.

8. The assembly of claim 7, wherein the grooves in the lead-in guide include a bottom surface aligned with a bottom surface of a groove in a card guide.

9. The lead-in guide of claim 8, wherein the bottom surface extends only across the front block section.

10. The lead-in guide of claim 6, formed of a plastic material.

11. A sheet metal circuit board carrier with a plurality of slots; and a lead-in guide comprising a slot section and a front section, wherein a plurality of grooves are cut completely through the slot section and partially through the front section to define a groove bottom and each of the ones of the groove bottoms aligns with a bottom of one of the plurality of slots.

12. The lead in guide of claim 11, formed of a plastic material.

13. The lead in guide of claim 11, further comprising at least one integral retention peg.

14. The lead in guide of claim 11 wherein both the front section and the slot section are substantially rectangular in cross-section.

* * * * *